US010848352B1

(12) United States Patent
Rathor et al.

(10) Patent No.: US 10,848,352 B1
(45) Date of Patent: Nov. 24, 2020

(54) TIME BASED FEED FORWARD EQUALIZATION (TFFE) FOR HIGH-SPEED DDR TRANSMITTER

(71) Applicant: Cadence Design Systems, Inc., San Jose, CA (US)

(72) Inventors: Balbeer Singh Rathor, Morena (IN); Vinod Kumar, Bangalore (IN); Aaron Willey, Hayward, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/726,759

(22) Filed: Dec. 24, 2019

(51) Int. Cl.
*G11C 11/4096* (2006.01)
*H04L 25/03* (2006.01)
*G11C 7/22* (2006.01)
*G11C 7/10* (2006.01)

(52) U.S. Cl.
CPC ...... *H04L 25/03121* (2013.01); *G11C 7/1057* (2013.01); *G11C 7/222* (2013.01); *H04L 25/03343* (2013.01)

(58) Field of Classification Search
CPC ....... G11C 7/22; G11C 7/1057; G11C 7/1066; G11C 11/4096; G11C 11/4076; G11C 11/406; H01L 2924/00; H01L 2225/48227; H01L 2225/73265; H01L 2225/0401; H01L 2225/32225; H04L 25/03121; H04L 25/03343
See application file for complete search history.

(56) References Cited

U.S. PATENT DOCUMENTS

| 7,348,824 B2 | 3/2008 | Naviasky et al. |
| 8,737,491 B1 | 5/2014 | Wilson et al. |
| 9,542,512 B1 | 1/2017 | Al-Hawari et al. |
| 9,589,627 B1 | 3/2017 | Wilson et al. |
| 9,754,646 B1 | 9/2017 | Kumar et al. |
| 9,767,888 B1 | 9/2017 | Ravi et al. |
| 9,811,273 B1 | 11/2017 | Brahmadathan |
| 9,997,214 B1 | 6/2018 | Kumar et al. |
| 10,128,965 B1 | 11/2018 | Wilson et al. |
| 2007/0001716 A1 | 1/2007 | Sanchez et al. |
| 2015/0237274 A1 | 8/2015 | Yang et al. |
| 2020/0127645 A1* | 4/2020 | Rao ........................ H03K 3/037 |

* cited by examiner

*Primary Examiner* — Sibin Chen
(74) *Attorney, Agent, or Firm* — Foley & Lardner LLP

(57) ABSTRACT

Circuits, methods and systems that are to be used for dynamically modulating a high frequency bit duration of data based on a status of one or more previous transmitted bits. One circuit comprises a first data path comprising a first input, a first buffer, and a first output connected to a first multiplexer data input. The circuit further comprises a second data path comprising a second input, a second buffer, a phase interpolator, and a second output coupled to a second multiplexer data input. The circuit further comprises a multiplexer having at least two data inputs, at least one control input, and a common output coupled to a transmitter signal line and wherein the at least one control input is operatively coupled to a generated control signal that is based on the status of one or more previous transmitted bits.

14 Claims, 8 Drawing Sheets

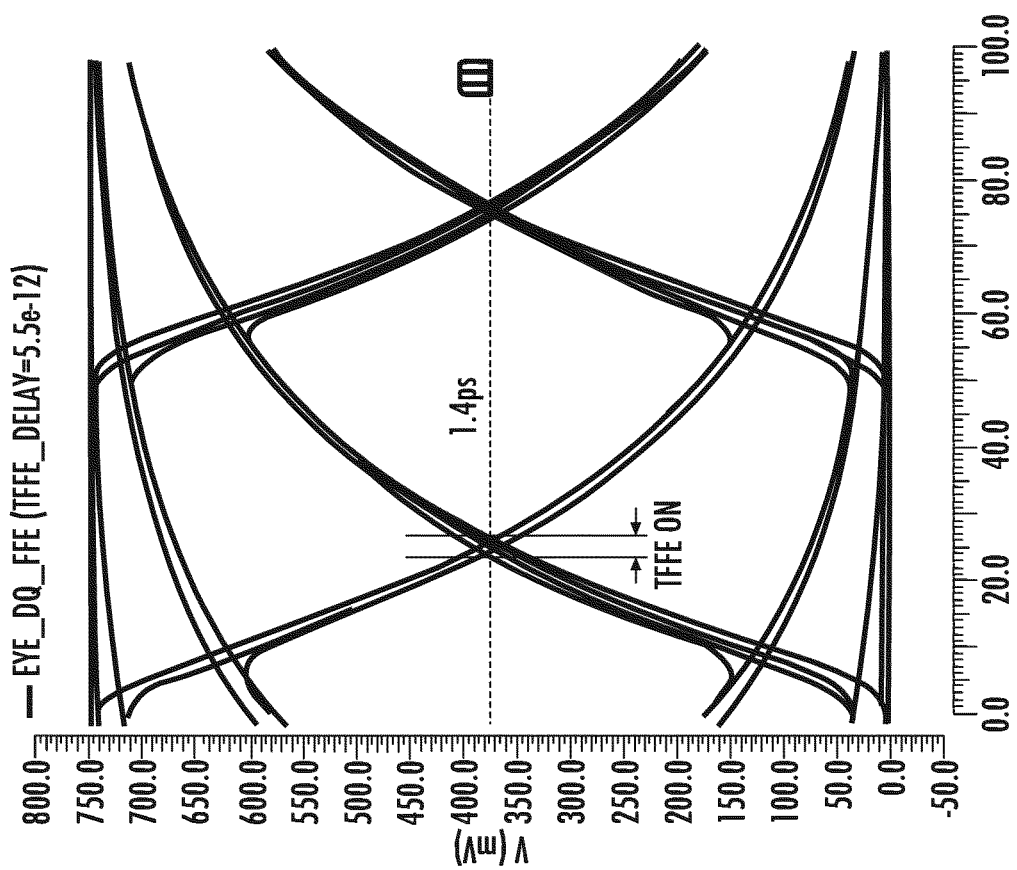

TIME BASED FEED FORWARD EQUALIZATION (TFFE) FOR HIGH-SPEED DDR TRANSMITTER

TECHNICAL FIELD

The present implementations relate generally to interface circuits with memory devices (e.g., double data rate (DDR) memory), and more particularly to memory interface transmitters for use with such memory devices.

BACKGROUND

A typical computing device is implemented with a microprocessor, memory, and a number of other modules depending on the function to be performed by the computing device. DDR random access memory (RAM) is a particular type of RAM commonly used in current technology that performs two read accesses or two write accesses per clock cycle. Microprocessors and DDR RAM both operate on different power supply voltages. Interface circuits that can convert between different signal levels and different drive levels are used to allow for compatible communications between microprocessors and memory devices.

As the DRAM sector approaches higher speeds in current and proposed DDR standard protocols, and while power and area restrictions continue to be imposed on interface circuits, their performance can suffer. A solution to these and other problems is thus desirable.

SUMMARY

Implementations described herein relate to circuits and techniques for dynamically modulating a high frequency bit duration of data based on a status of one or more previous transmitted bits. The circuit comprises a first data path comprising a first input, a first buffer, and a first output connected to a first multiplexer data input. The circuit comprises a second data path comprising a second input, a second buffer, a phase interpolator, and a second output coupled to a second multiplexer data input. Further, the circuit comprises a multiplexer having at least two data inputs, at least one control input, and a common output coupled to a transmitter signal line and wherein the first input and the second input are operatively coupled to a serialized data signal, and wherein at least one control input is operatively coupled to a generated control signal that is based on the status of one or more previous transmitted bits. In some implementations, the multiplexer selects one of the first data path or the second data path to transmit a dynamically modulated output signal through the common output through the transmitter signal line based on the generated control signal. In various implementations, a high speed transmitter is driven by the common output of the multiplexer and operatively coupled by the transmitter signal line. In some implementations, the phase interpolator is configured to add a programmable delay to the second data path. In various implementations, the programmable delay is controlled by a tap coefficient and is process voltage and temperature independent. In some implementations, the circuit further comprises m+1 data paths comprising m+1 inputs, m+1 buffers, m phase interpolators, and m+1 outputs coupled to the multiplexer with m+1 data input and m control signals are based on previous m bit transitions, and wherein m represents a number of tap coefficients associated with a programmable delay. In various implementations, each of the first buffer and the second buffer operate at a core voltage level and are configured to provide a digital signal transformation from one portion of the circuit to another portion of the circuit. In some implementations, the circuit is implemented in a digital domain utilizing one or more digital logic gates, one or more inventers, and one or more multiplexers, such that the circuit is implemented outside an input/output area.

Some implementations relate to a system for dynamically modulating a high frequency bit duration of data based on a status of one or more previous transmitted bits. The system comprises a feed forward equalizer configured to provide a dynamically modulated output signal to a transmitter signal line. The system comprises a control signal generator configured to provide the feed forward equalizer a generated control signal that is based on the status of one or more previous transmitted bits and wherein the dynamically modulated output signal is operatively coupled to at least one data path that includes a phase interpolator that is configured to add a programmable delay to the at least one data path. In some implementations, the system further comprises a serialized data line configured to provide a serialized data signal to the feed forward equalizer and the control signal generator, wherein the serialized data line provides the status of one or more previous transmitted bits. In various implementations, a high speed transmitter is driven by the dynamically modulated output signal of the feed forward equalizer and operatively coupled by the transmitter signal line. In some implementations, the programmable delay is controlled by a tap coefficient and is process voltage and temperature independent. In various implementations, the feed forward equalizer includes a multiplexer having at least two data inputs, at least one control input, and a common output coupled to the transmitter signal line. In some implementations, the dynamically modulated output signal is determined based on the status of one or more previous transmitted bits.

Some implementations relate to a method for time based feed-forward equalization. The method includes receiving a serialized data signal. The method includes commonly providing the serialized data signal to a flip-flop and a control signal generator. The method includes commonly providing an output of the flip-flop into a first data path and a second data path. Further the method includes applying a programmable delay to the second data path. Further the method includes receiving, at a multiplexer, an early data signal from the first data path, a late data signal from the second data path, and a generated control signal from the control signal generator, wherein the generated control signal is based on a status of one or more previous transmitted bits and sending, by the multiplexer, a dynamically modulated output signal. In some implementations, the method further comprises determining a maximum delay modulation based on the early data signal and the late data signal and selecting, by the multiplexer, the early data signal or the late data signal to be used as the dynamically modulated output signal based on the status of one or more previous transmitted bits. In various implementations, the method further comprises commonly providing the output of the flip-flop into m+1 data path. In some implementations, the method further comprises applying m programmable delay to generate m delayed data paths and providing, to the multiplexer, m+1 data signals and m control signals based on previous m transmitted bits, and wherein m represents m represents a number of tap coefficients associated with the programmable delay. In some implementations, the method further comprises determining a maximum delay modulation based on the m+1 data signals and selecting, by the multiplexer, one of the m+1 data signals to be used as the dynamically modulated output signal based on the status of one or more previous transmitted bits. In some implementations, the programmable delay is controlled by a tap coefficient and is process voltage and temperature independent. In various implementations, the serialized data signal provides the status of one or more previous transmitted bits.

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 3C and FIG. 3D are example signal eye diagram in connection with the single-tap time based feed forward equalization architecture shown in FIG. 3A, according to a plurality of illustrative implementations;

DETAILED DESCRIPTION

Figure 1:
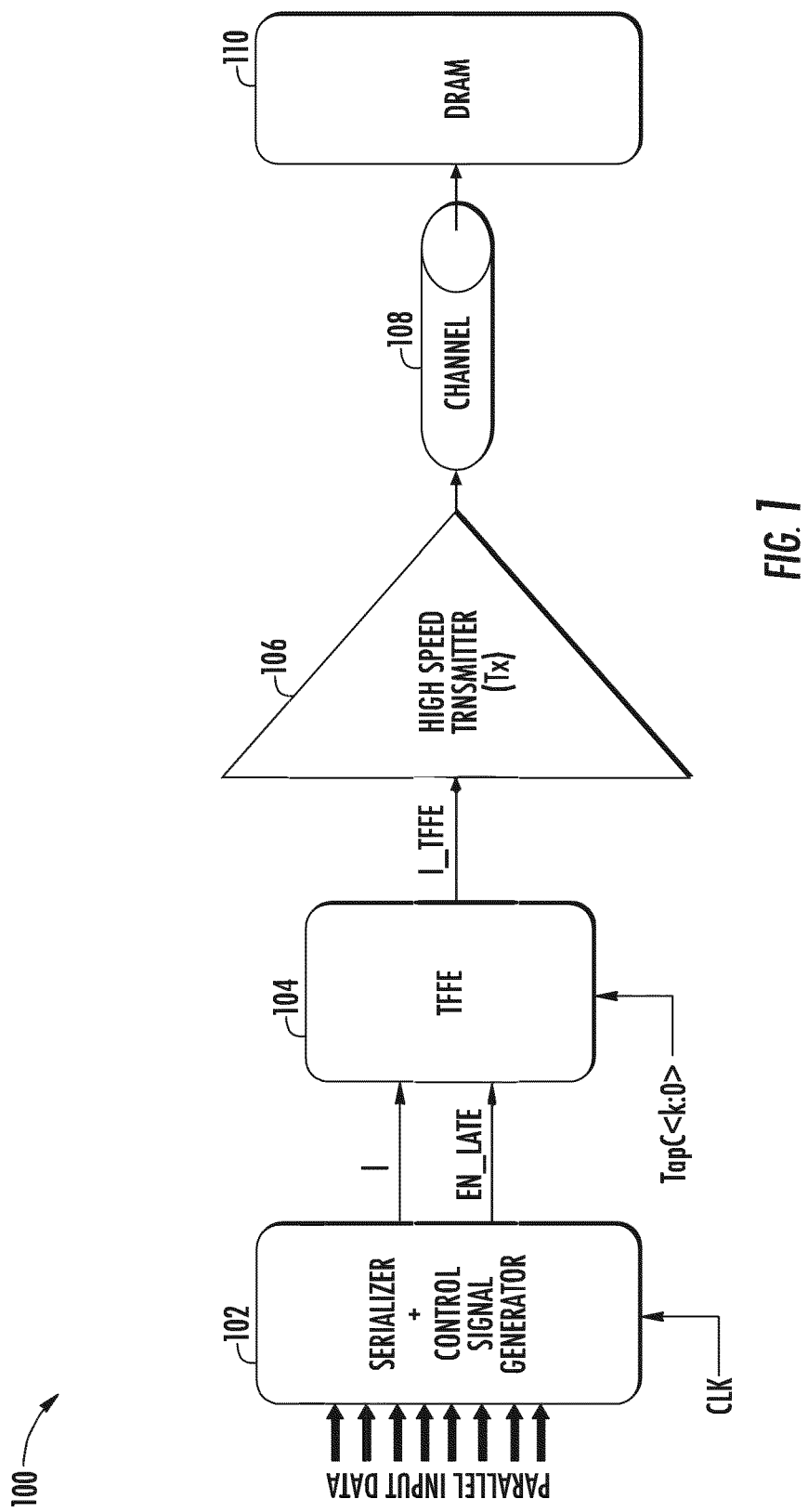
FIG. 1 is a block diagram of an example of time based feed forward equalization integrated in a high speed transmitter path, according to an illustrative implementation.

Referring generally to the FIGURES, the systems and methods relate generally to circuits and techniques for dynamically modulating a high frequency bit duration of data based on a status of one or more previous transmitted bits, particularly in memory devices such as DDR SDRAM in accordance with protocols and standards such as GDDR6. In some implementations, the causal configuration of the circuit can include configuring a time based feed forward equalizer such that it operates based on the status of one or more previous transmitted bits. The time based feed forward equalizer can further include one or more parallel data paths configured to provide programmable delay such that a multiplexer can select one of the parallel data paths going to a transmitter based on one or more select signals generated dynamically based on the status of one or more previous transmitted bits.

In many systems, the high speed DDR input/outputs like GDDR6 include a transmitter that is operating at speeds of 18 Gbps and above. Due to the transmitter high speed data rate, the system experiences a great amount of Inter-Symbol Interference (i.e., ISI) jitter and as a result reduces the timing margin for the system. Thus, such systems should allow signals sufficient time to reach the proper logic level by incorporating equalization techniques for high speed transmitters which are Power Performance and Area (i.e., PPA) efficient, which techniques should equalize both the driver stage ISI jitter as well as the Process Voltage and Temperature (i.e., PVT) dependent ISI jitter of the intermediate data path. This should further provide existing high-speed DDR driver architectures enhanced flexibility to achieve 18 Gbps data rates and above for a GDDR6 architecture. This approach provides existing high-speed DDR driver architectures significant improvements to the jitter due to ISI throughout the system (e.g., driver stage, intermediate stage). Therefore, aspects of the present disclosure address problems in existing high-speed DDR driver architectures by providing an improved equalization technique utilizing the status of one or more previous transmitted bits and improving overall power, performance, area (i.e., PPA). This approach can also provide enhanced characteristics of existing high-speed DDR driver architectures such that the improved equalization technique has no impact on the DC power consumption or the chip die pad (i.e., PAD) capacitance and can be implemented in purely the digital domain utilizing phase interpolators to generate one or more fine delays and thus, easy to port from one node to another node.

Accordingly, the present disclosure is directed to systems and methods for dynamically modulating a high frequency bit duration of data based on a status of one or more previous transmitted bits. That is, dynamical modulating the high frequency bit duration improves ISI jitter introduced throughout each stage of the system (e.g., the transmitter data path ISI as well as the PAD ISI). This can be accomplished by a control signal generator sending control signals based on the status of one or more previously transmitted bits to a multiplexer that selects a parallel data path that can include programmable delay to ultimately provide a dynamically modulated output signal to a transmitter. Furthermore, said architecture can ensure that the transmitter is receiving signals at the proper logic level, further improving system performance (e.g., reducing transmitter jitter performance for the GDDR6 transmitter operating at 18 Gbps).

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation. Other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Referring now to FIG. 1, a block diagram of a time based feed forward equalization (TFFE) integrated in a high speed transmitter path 100 is shown, according to an illustrative implementation. In broad view, the time based feed forward equalization integrated in a high speed transmitter path 100 can include a serializer and control signal generator 102, a time based feed forward equalizer 104, a high speed transmitter 106, a channel 108, and a DRAM 110. Generally, the arrows throughout the time based feed forward equalization integrated in a high speed transmitter path 100 provide a signal transmission path from the serializer and control signal generator 102 to the DRAM 110. In some implementations, the serializer and control signal generator 102 receive parallel input data from a controller in which it becomes serialized into a high speed data signal. The high speed data signal is provided to the time based feed forward equalizer 104 where the high speed data signal is modulated based on a status of the one or more previous transmitted bits. A dynamical modulated signal is selected and fed by the time based feed forward equalizer 104 to the high speed transmitter 106. The high speed transmitter 106 then feeds a representation of the dynamical modulated signal through the channel 108 to the DRAM 110.

The serializer and control signal generator 102 can be configured to serialize parallel input data streams (e.g., a status of the one or more previous transmitted bits) into high rate single-bit streams that can be sent through a communication channel to other components (e.g., control signal generator 302B, 1-tap time based feed forward equalization circuit 304). The control signal generator associated with the serializer and control generator 102 can be configured to receive data over the communication channel from the serializer and subsequently generate a signal based on the status of the one or more previous transmitted bits.

The time based feed forward equalizer 104 can be configured to receive data over the communication channel from the serializer and control signal generator 102 and subsequently add a delay to one or more signals. The time based feed forward equalizer 104 then allows for selection of a dynamically modulated signal based on the status of the one or more previous transmitted bits and that are subsequently sent to the high speed transmitter 106.

In some implementations, the high speed transmitter 106 can be configured to receive an input signal (e.g., the dynamical modulated signal) and transmit a representation of the input signal using a transmission (i.e., TX) driver. The TX driver may be a single ended driver or may be a differential driver depending on the communication standard by which the transmitter communicates.

In some implementations, the channel 108 can be configured to connect the high speed transmitter 106 to the DRAM 110. In some implementations, the DRAM 110 (i.e., dynamic random access memory) can be configured as a memory module such that it receives data from the high speed transmitter 106. In some implementations, the DRAM 110 can include a bus, which can include an address bus, a data bus, read-write (R/W) signals, and a chip-enable (CE) signal as is known to those skilled in the art.

Figure 2:
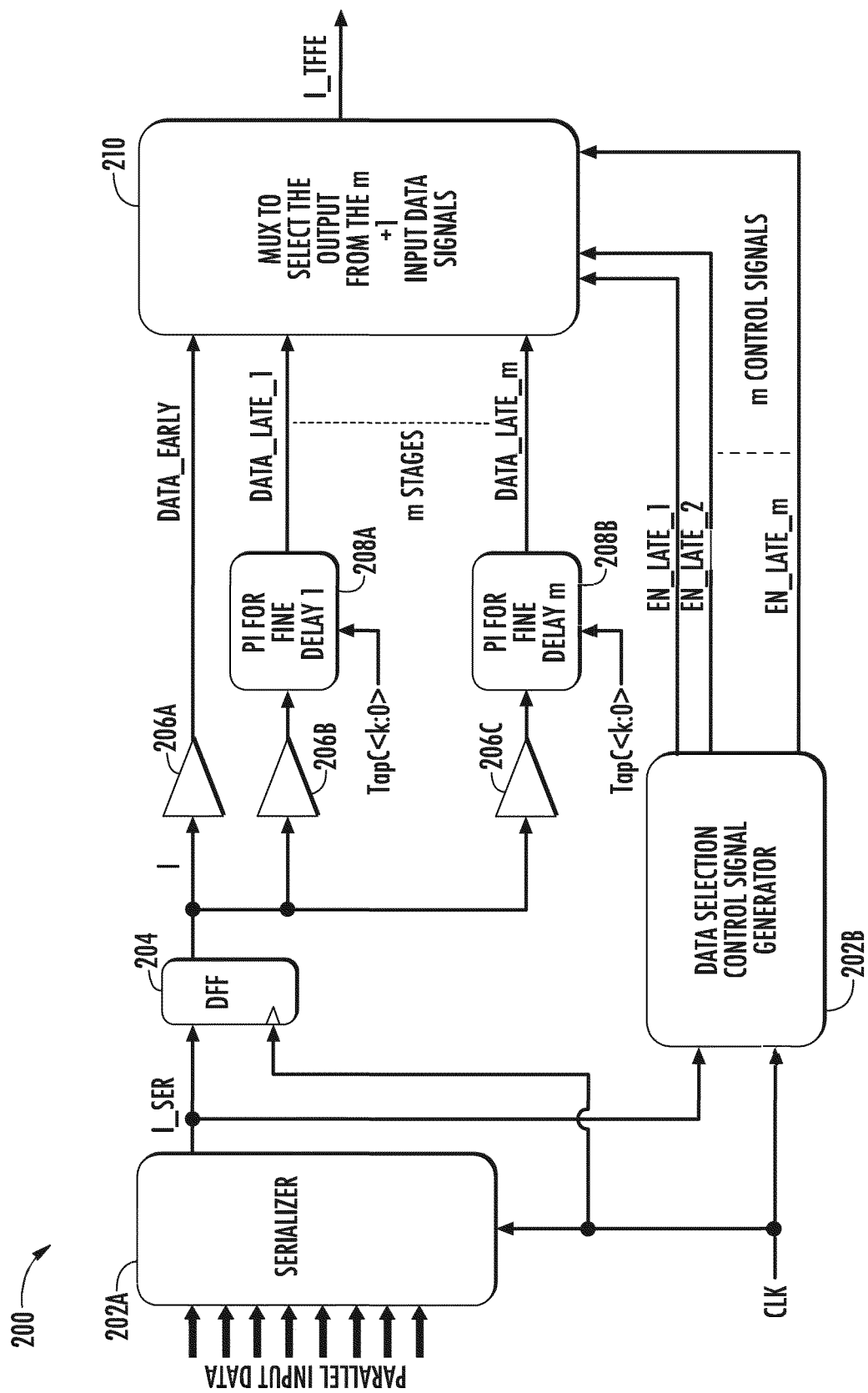
FIG. 2. is a block diagram illustrating a multi-tap time based feed forward equalization architecture, according to an illustrative implementation.

Referring now to FIG. 2, a block diagram of a multi-tap time based feed forward equalization architecture 200 is shown, according to an illustrative implementation. In broad view, the multi-tap time based feed forward equalization architecture 200 can include a serializer 202A, a data selection control signal generator 202B, a flip-flop 204 (e.g. a DFF), a buffer 206A, a buffer 206B, a buffer 206C, a phase interpolator 208A, a phase interpolator 208B, and a multiplexer 210. Generally, the arrows throughout the multi-tap time based feed forward equalization architecture 200 provide a signal transmission path from the serializer 202A to the multiplexer 210. The serializer 202A receives parallel input data from a controller in which it is serialized and outputted as shown as signal I_SER. The serialized signal I_SER provides the status of one or more previous transmitted bits. The flip-flop 204 receives signal I_SER data and outputs signal I based on a signal edge of the clock. Each buffer (e.g., buffer 206A, 206B, and 206C) receives a commonly provided signal I and is configured to provide sufficient drive capability to pass each signal along to a succeeding stage. Buffer 206A outputs signal DATA_EARLY such that signal DATE_EARLY is provided to a data input of multiplexer 210. Buffer 206B outputs signal I that is received by the phase interpolator 208A. Phase interpolated 208A is configured with a tap coefficient (e.g., TapC) and is PVT dependent such that it can add a fine delay 1 to signal I before signal DATA_LATE_1 is provided to a data input of multiplexer 210. This step occurs in parallel with buffer 206C but instead adds fine delay m to signal I before signal DATA_LATE_m is provided to a data input of multiplexer 210. Furthermore, data selection control signal generator 202B receives signal I_SER from serializer 202A and is configured to provide at least one output signal (e.g., EN_LATE_1, EN_LATE_2, EN_LATE_m) to a control input of the multiplexer 210 such that the output signal is based on a status of one or more previous transmitted bits. Multiplexer 210 selects one of the data inputs (i.e., dynamically modulated signals) based on the control signal input and in turn outputs the selected dynamically modulated signal as signal I_TFFE through a transmitter signal line to a transmitter (e.g. high speed transmitter 106)

The serializer 202A resembles similar features and functionality, described in detail with reference to FIG. 1. However, in some implementations, the serializer 202A converts parallel data from the controller (e.g., serializer 202A receives 8 parallel input data bits from controller at 2 Gbps and convert it into serialized data of speed 18 Gbps) into serialized data (e.g., I_SER) and is outputted based on a signal edge of the clock. For example, low speed data is received by the serializer 202A, and the serializer 202A serializes the data such that the data is outputted one at a time based on a rising edge of a 16 GHz clock. The outputted serialized data is commonly divided such that it is received by the flip-flop 204 and the data selection control signal generator 202B.

The data selection control signal generator 202B resembles similar features and functionality, described in detail with reference to FIG. 1. However, in some implementations, the data selection control signal generator 202B generates one or more control signals based on present and past serialized data received by the serializer 202A. Thus, the one or more control signals are outputted by the selection control signal generator 202B when a signal edge of the clock is received. In particular, the one or more control signals based on previous bit transitions are provided to one or more control inputs of multiplexer 210. In some implementations, the number of control signals generated is based on the number of taps used for the multi-tap time based feed forward equalization architecture 200. For example, if the a 3-tap multi-tap time based feed forward equalization architecture 200 is used, the data selection control signal generator 202B will generate 3 control signals. Thus, the data selection control signal generator 202B generated control signals would be based on the previous 3 bit transitions. In another example, if the 1-tap multi-tap time based feed forward equalization architecture 200 is used, the data selection control signal generator 202B will generate 1 control signal. Thus, the data selection control signal generator 202B generated control signal would be based on the previous 1 bit transition. (e.g., single-tap time based feed forward equalization architecture 300).

In some implementations, the flip-flop 204 can copy the input it receives (e.g., signal I_SER) to its output (e.g., signal I) when instructed by a signal edge of the clock. For example, signal I_SER can be received at the input of flip-flop 204 from the serializer 202A. Signal I_SER is then "copied" and outputted as signal I when a rising edge of the clock is received.

In some implementations, each buffer 206A, 206B, and 206C receives the commonly divided signal I as an input. Each buffer then provides a digital signal from one portion of the multi-tap time based feed forward equalization architecture 200 to another. In some implementations, the buffer is a combination of two series inverters which takes a digital signal as an input and outputs the digital signal in the same phase with enhanced signal strength. In some implementations, each buffer can be configured variably such that each buffer is configured differently. In some implementations, there may be fewer or more buffers than as shown.

In some implementations, the output signal of the one or more buffers (e.g., 206B, and 206C) can be transmitted to a phase interpolator (e.g., 208A, and 208B). As shown, the output of buffer 206B is input into the phase interpolator 208A. Also as shown, the output of buffer 206C is input into the phase interpolator 208B. Generally, the phase interpolator is configured to add a delay based on a function of PVT. In some implementations, each phase interpolator is configured such that it is PVT dependent based on a PVT condition. More particularly, the PVT condition is determined based on the transmitters current speed. For example, if the transmitter is operating with fast delay (e.g., 10 ps) the delay generation will become fast and in turn produce a less wider pulse modulation (e.g., less wider logic high, or less wider logic low in relation to FIG. 3B, signal I_TFFE). In another example, if the transmitter is operating with slow delay (e.g., 15 ps) the delay generation will become slow and in turn produce a wider pulse modulation (e.g., more wider logic high, or more wider logic low in relation to FIG. 3B, signal I_TFFE). Thus, the phase interpolator is auto-tracking the PVT condition and applying a delay based on the current PVT condition. Additional details relating to the functions of the phase interpolator in relation to delay generation are provided herein with respect to FIGS. 4B, 4C, and 4D.

In some implementations, each phase interpolator can include a tap coefficient (e.g., TapC). Generally, the tap coefficient applies a programmable delay to each data path before it is sent to a data input of multiplexer 210 such that each data signal passed through the phase interpolator travels through one or more delay stages. In particular, each delay stage has a delay control controlled by the TapC coefficient such that each phase interpolator can provide a different delay. For example, when the tap coefficient is 2, each phase interpolator can produce 4 (i.e., $2^{Tap\ Coefficient}$) different delays (i.e., 3 down to 0), such that delay 0 can be interpreted as providing the least delay to the signal and delay 3 can be interpreted as providing the maximum delay to the signal. In another example, when the tap coefficient is 4, each phase interpolator can produce 16 different delays (i.e., 15 down to 0), such that delay 0 can be interpreted as providing least delay to the signal and delay 15 can be interpreted as providing the maximum delay to the signal. Thus, the data signals sent to the inputs of the multiplexer 210 can include a tap dependent delay.

In some implementations, the tap coefficient delay (i.e., the delay provided by each stage of the phase interpolator) can be configured based on a given optimal condition established during initial training of the system. For example, during initial training of the system, the system can transmit data and the tap coefficient delay can be modulated such that the system can determine what tap coefficient delay is desired during optimal conditions.

The multi-tap time based feed forward equalization architecture 200 includes multiplexer 210. The multiplexer 210 includes a plurality of data inputs and a plurality of control inputs. The data inputs receives the dynamical modulated signal (e.g., signal DATE_EARLY, signal DATA_LATE_1, signal DATA_LATE_m) and in turn selects one of the dynamically modulated signals based on the control inputs receiving the generated control signals (e.g., signal EN_LATE_1, signal EN_LATE_2, signal EN_LATE_m). In some implementations, the selected dynamical modulated signal is transmitted as signal I_TFFE through a communication line to a transmitter (e.g., high speed transmitter 106).

In various implementations, the multi-tap time based feed forward equalization architecture 200 can be implemented in a digital domain utilizing one or more digital logic gates, one or more inventers, and one or more multiplexers. In particular, the multi-tap time based feed forward equalization architecture 200 can be implemented in a full digital synthesis and route flow using standard cells, analog design flow using custom cells, full-custom digital flow, or any combination of the three. In some implementations, the multi-tap time based feed forward equalization architecture 200 can be added in series with the data path, as discussed in detail with reference to FIG. 1. Thus, the multi-tap time based feed forward equalization architecture 200 can be implemented separately outside and may not be part of an input/output area.

Figure 3A:
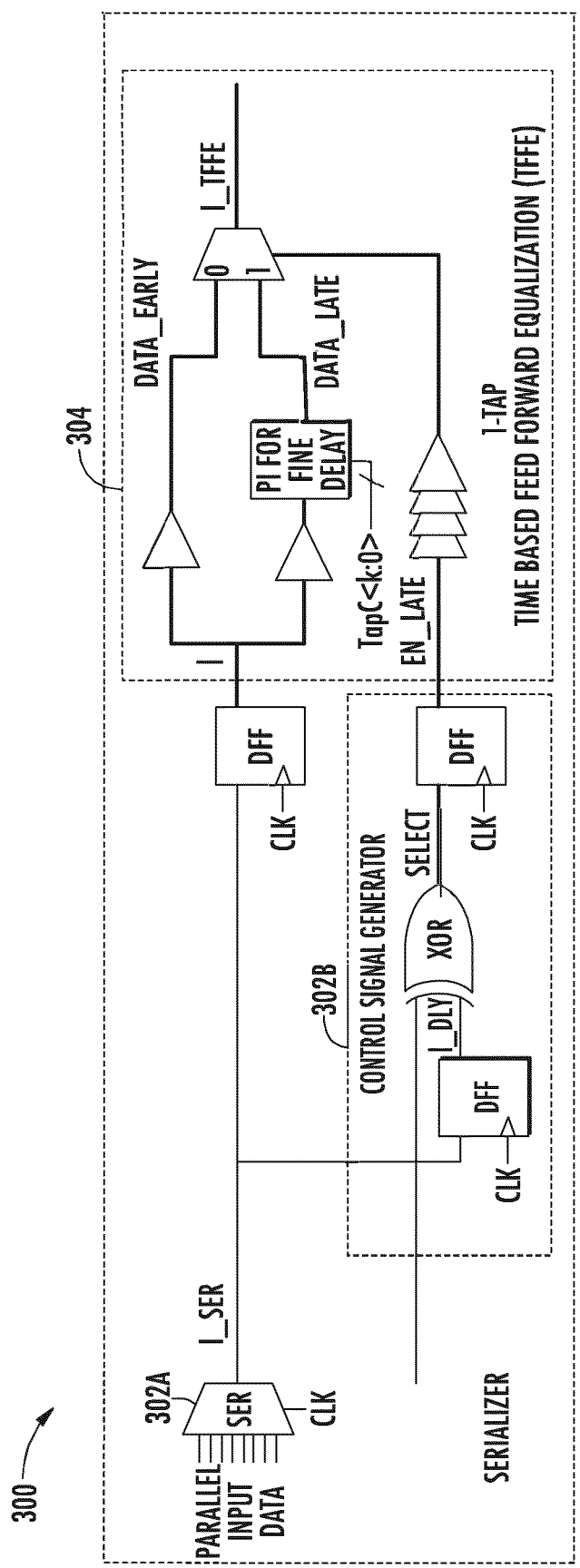
FIG. 3A is a block diagram illustrating a single-tap time based feed forward equalization architecture, according to an illustrative implementation.

Referring now to FIG. 3A, a block diagram example of a single-tap time based feed forward equalization architecture 300 is shown, according to an illustrative implementation. In broad view, the single-tap time based feed forward equalization architecture 300 can include a serializer 302A, a data selection control signal generator circuit 302B, and a 1-tap time based feed forward equalization circuit 304 (i.e., TFFE). The single-tap time based feed forward equalization architecture 300 resembles similar features and functionality, described in detail with reference to FIG. 2. As shown, instead of utilizing a plurality of buffers and signal lines as data inputs into a multiplexer, the 1-tap time based feed forward equalization circuit 304 (i.e., tap coefficient equal to 1) includes signal DATA_EARLY and signal DATA_LATE as data inputs into the multiplexer. Also as shown, the control signal generator circuit 302B provides a single signal EN_LATE to the control input of the multiplexer.

Figure 3B:
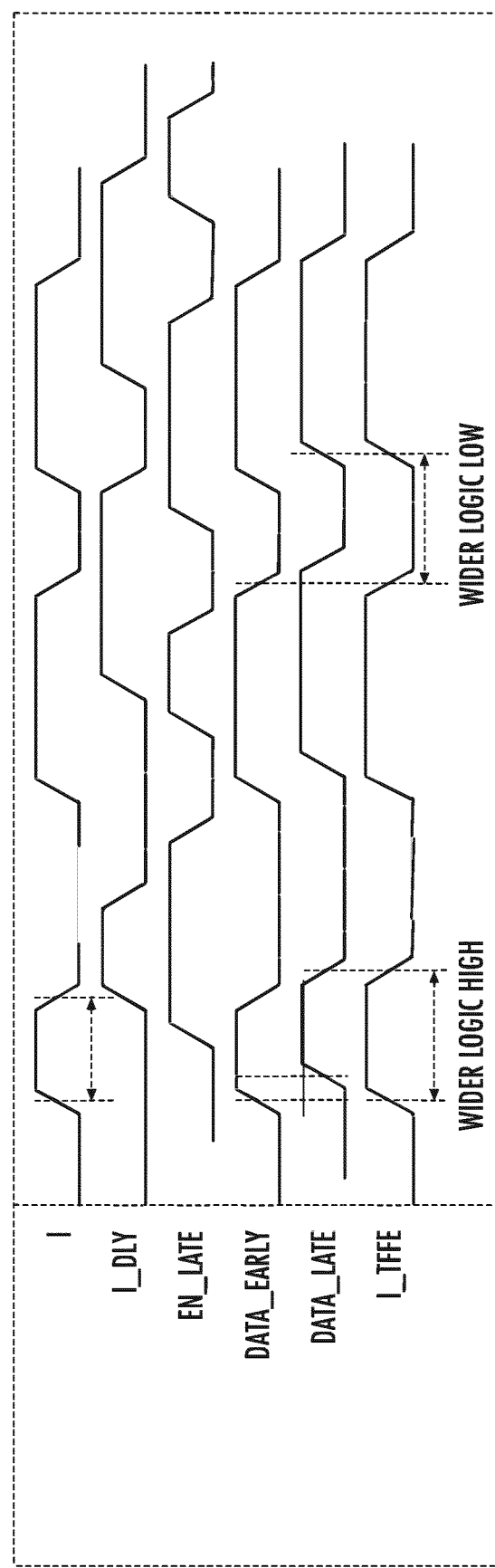
FIG. 3B is an example signal timing diagram in connection with the single-tap time based feed forward equalization architecture shown in FIG. 3A, according to an illustrative implementation, according to an illustrative implementation.

Referring now to FIG. 3B, an example signal timing diagram in connection with the single-tap time based feed forward equalization architecture 300 is shown, according to an illustrative implementation. As shown, signal I is the present input data, and signal I_DLY is the previous one bit delay data such that it indicates the previous one bit information. Signal EN_LATE is generated based on signal I and signal I_DLY. In some implementations, signal EN_LATE operate in accordance with an XOR gate. For example, signal EN_LATE will stay low when the present bit (i.e., signal I) and the previous bit (i.e., signal I_DLY) are both the same (e.g. both high or both low), whereas if the present bit is high and the previous bit is low or present bit is low and the previous bit is high, it indicates a transition and thus, signal EN_LATE will transition and become high. Also as shown, depending on signal EN_LATE being high or low, signal I_TFFE will be transmitted utilizing signal DATA_E-ARLY or signal DATE_LATE. For example, if signal EN_LATE is low, signal DATA_EARLY is selected and signal I_TFFE is transmitted utilizing signal DATA_E-ARLY, whereas if signal EN_LATE is high, signal DATA_LATE is selected and signal I_TFFE is transmitted utilizing signal DATE_LATE. Moreover as shown, when utilizing single-tap time based feed forward equalization architecture 300, signal I_TFFE becomes wider logic high such that when the system is switching from long low to high, signal I_TFFE is configured to have a logic high for a longer period of time (i.e., wider logic high) which allows more time for each stage of the path to settle and reach the proper logic level. In turn, signal I_TFFE becomes wider logic low such that when the system is switching from long high to low, signal I_TFFE is configured to have a logic low for a longer period of time (i.e., wider logic low) which allows more time for each stage of the path to settle and reach the proper logic level. The wider logic high and wider logic low for signal I_TFFE signal allows the system more time to complete a bit transition and thus improves the ISI jitter due to the internal data path as well as the final output at the PAD.

Referring now to FIG. 3C and FIG. 3D, example signal eye diagrams in connection with the single-tap time based feed forward equalization architecture 300 are shown, according to a plurality of illustrative implementations. Both FIG. 3C and FIG. 3D display a transient wave form output of an RC Channel (e.g., RC channel indicates that the channel is a series combination of only resistors and capacitors.). FIG. 3C displays the eye diagram of transient wave form output without applying any signal equalization, and as shown,? exhibits 7.6 ps of ISI jitter. FIG. 3D displays the eye diagram of transient wave form output applying signal equalization based on single-tap time based feed forward equalization architecture 300 and as shown, exhibits 1.4 ps of ISI jitter, thus reducing the ISI jitter by 6.2 ps and improving the timing margin for the system.

Figure 4A:
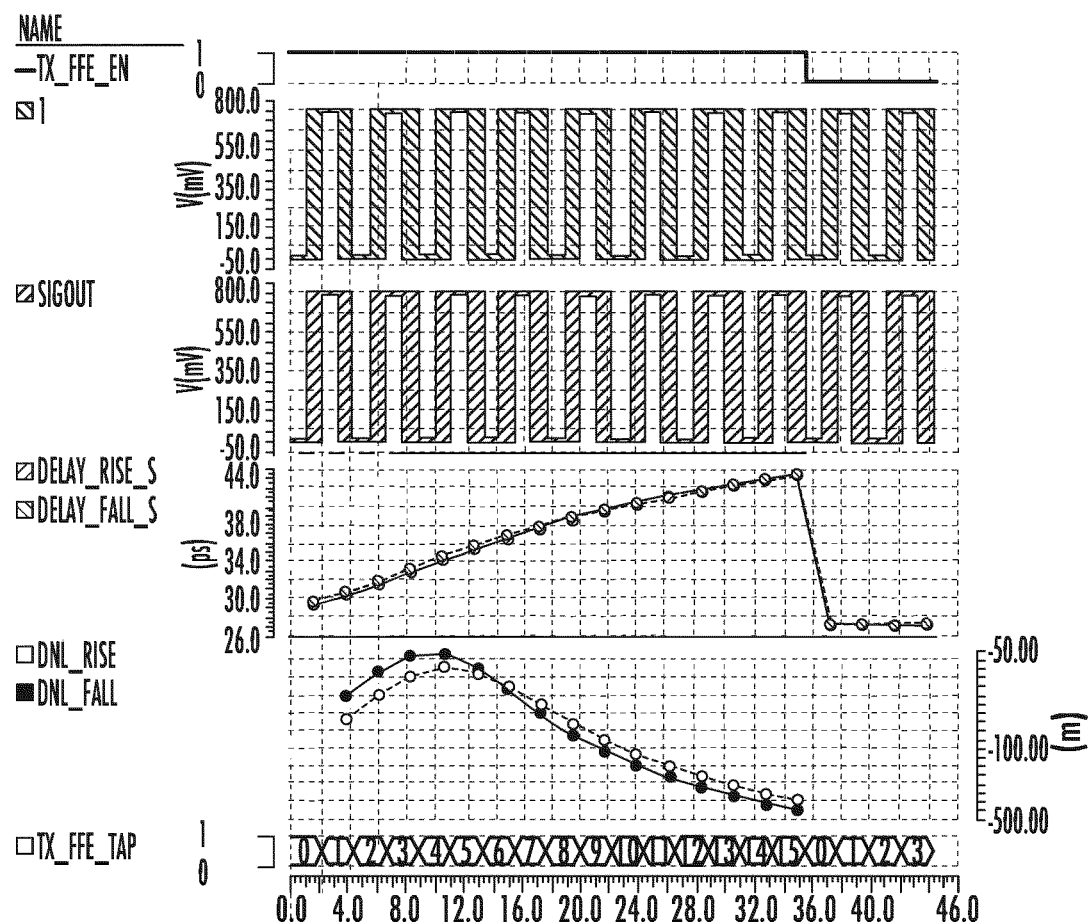
FIG. 4A is an example of multiple timing delays utilizing a phase interpolator (PI) in connection with the single-tap time based feed forward equalization architecture shown in FIG. 3A, according to an illustrative implementation.

Referring now to FIG. 4A, an example of multiple timing delays utilizing a phase interpolator (PI) in connection with the single-tap time based feed forward equalization architecture 300 is shown, according to an illustrative implementation. FIG. 4A as shown, includes a phase stepping test utilizing single-tap time based feed forward equalization architecture 300. FIG. 4A depicts the phase interpolator delay change with the change in tap coefficient [e.g. TapC]. FIG. 4A also depicts Differential Non Linearity (DNL) of phase interpolator with the change in the tap coefficient.

Figure 4B:
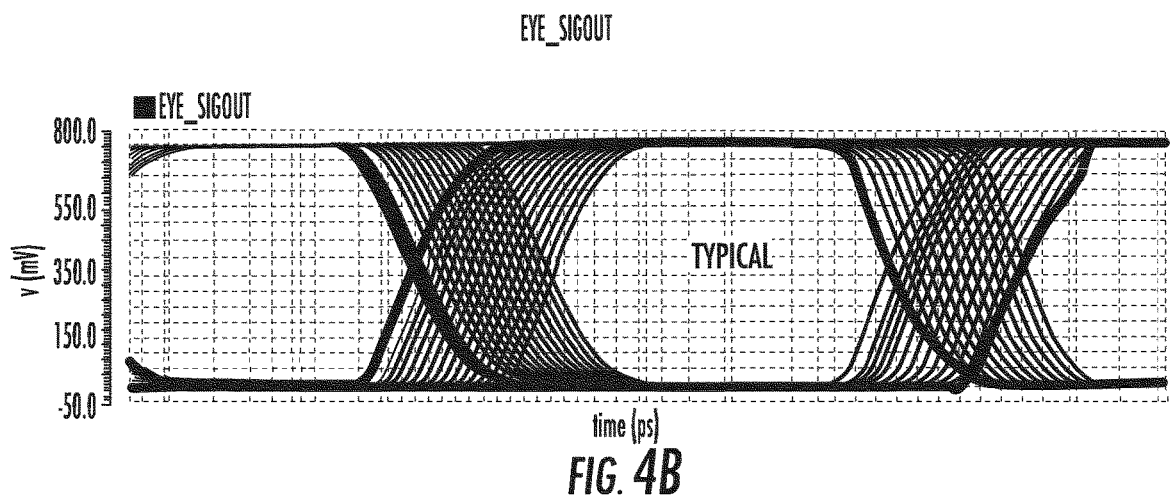
FIGS. 4B-4D are example signal eye diagrams in connection with the single-tap time based feed forward equalization architecture shown in FIG. 3A, according to a plurality of illustrative implementations.
Figure 4C:
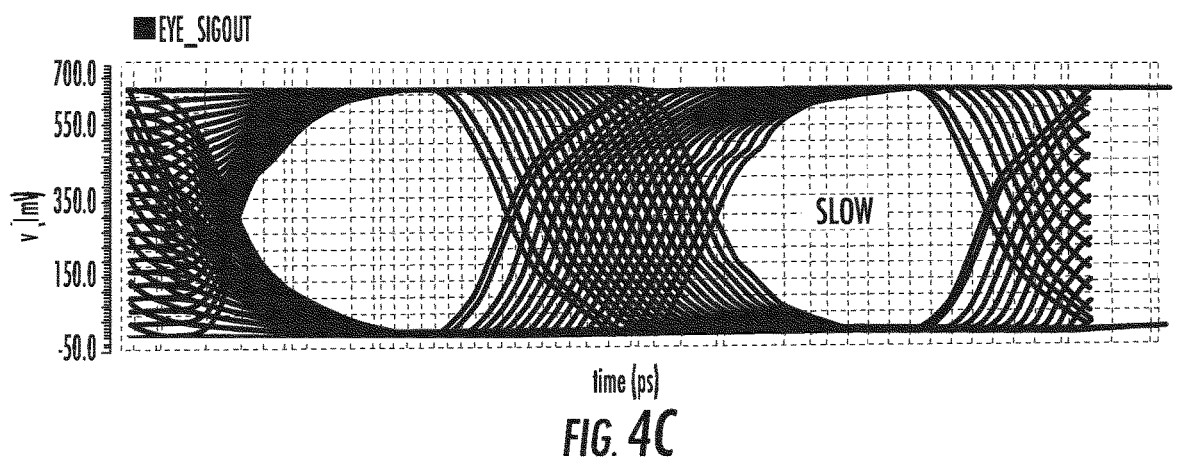
Figure 4D:
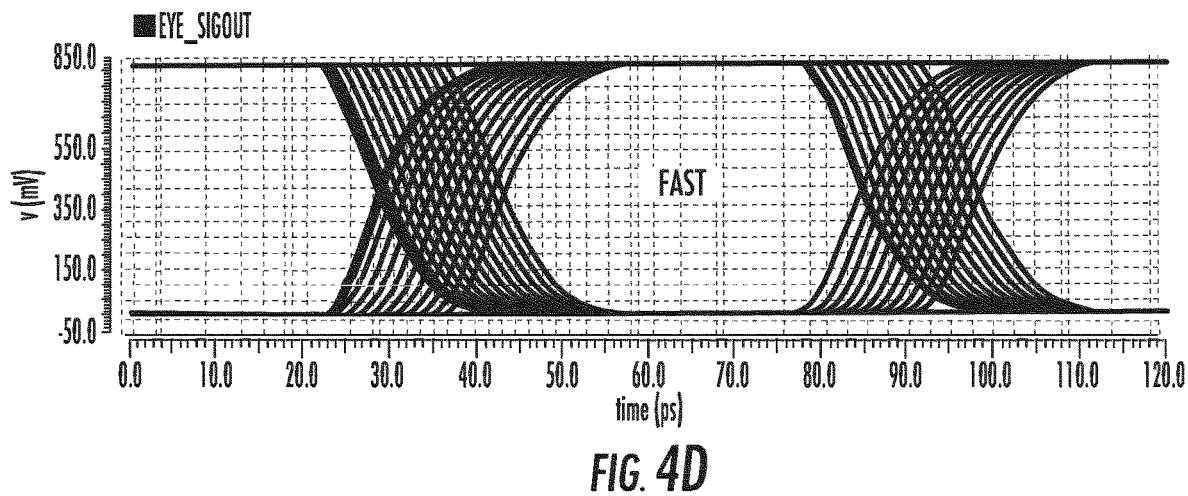

Referring now to FIGS. 4B-4D, example signal eye diagrams in connection with the single-tap time based feed forward equalization architecture 300 are shown, according to a plurality of illustrative implementations. As shown, with respect to FIG. 4B, the PVT condition of the transmitter is "typical." For typical PVT the phase interpolator delay spread is medium (e.g., 12 ps), thus the delay generation step will become medium such that the pulse modulation will become medium wider. Also as shown, with respect to FIG. 4C, the PVT condition of the transmitter is "slow." For slow PVT, the phase interpolator delay spread is large (e.g., 15 ps) thus, the delay generation step will become large such that the pulse modulation will become more wider (e.g., wider logic high, or wider logic low in relation to FIG. 3B, signal I_TFFE). Also as shown, with respect to FIG. 4D, the PVT condition of the transmitter is "fast." For Fast PVT, the phase interpolator delay spread is small (e.g., 10 ps) thus, the delay generation step will become small such that the pulse modulation will become less wide (e.g., less wider logic high, or less wider logic low in relation to FIG. 3B, signal I_TFFE). Thus, the single-tap time based feed forward equalization architecture 300 compensates across all PVT corners and in turn improves the transmitter internal data path ISI as well as the PAD ISI.

Figure 5A:
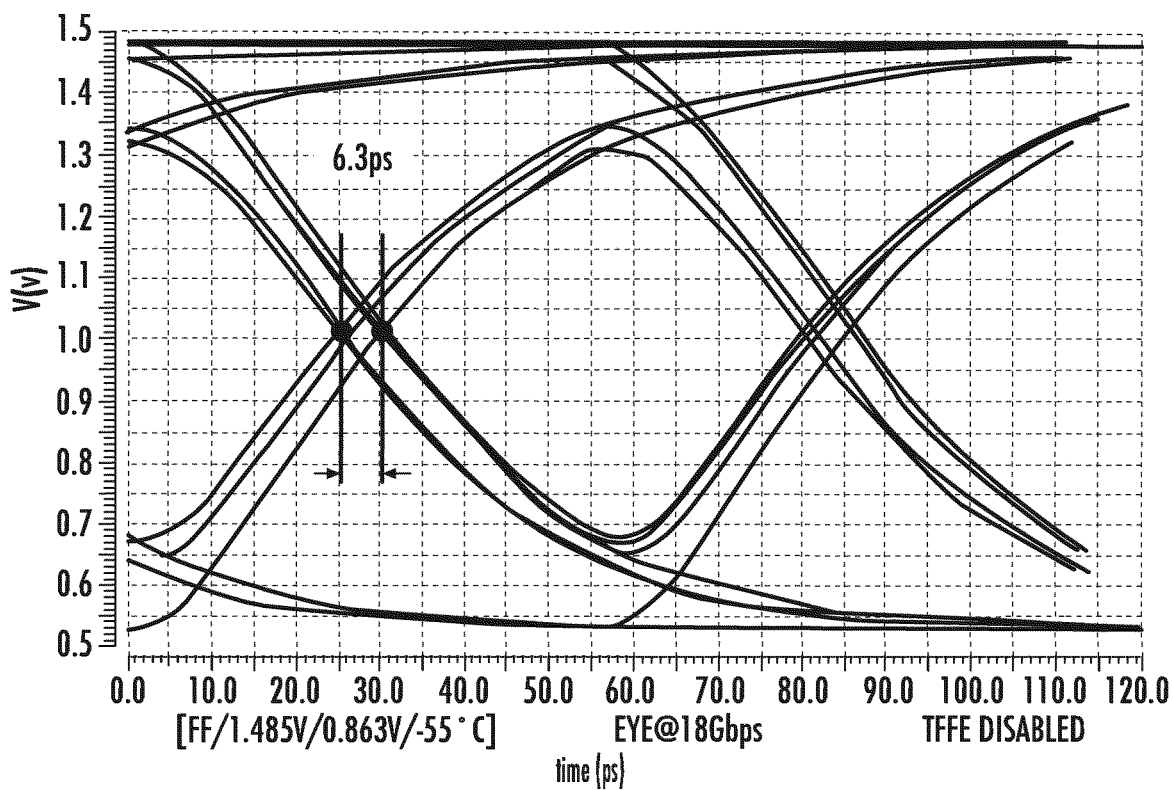
FIGS. 5A-5B are example signal eye diagrams in connection with the single+forward equalization architecture shown in FIG. 3A, according to a plurality of illustrative implementations.
Figure 5B:
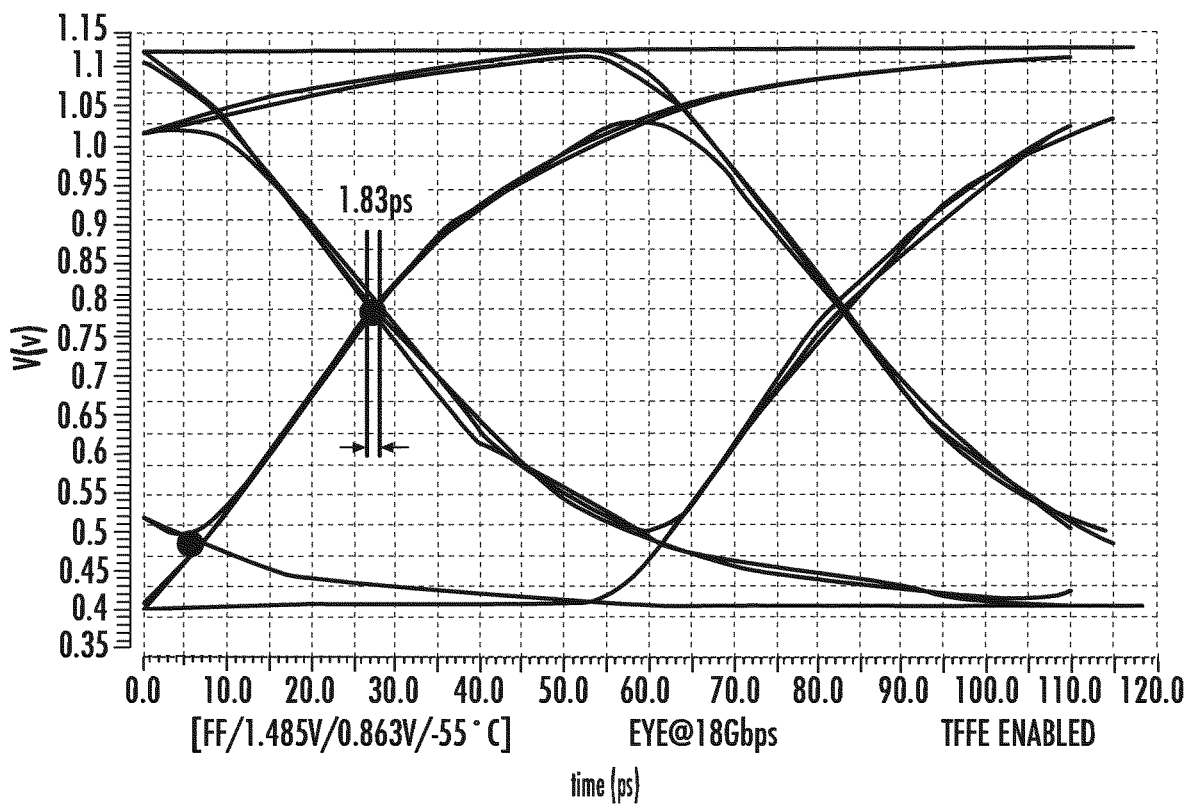

Referring now to FIGS. 5A-5B, example signal eye diagrams in connection with the single-tap time based feed forward equalization architecture 300 are shown, according to a plurality of illustrative implementations. FIG. 5A displays a transient wave form output implemented on the GDDR6 transmitter when TFFE is disabled. FIG. 5B displays a transient wave form output implemented on the GDDR6 transmitter when TFFE is enabled.

FIG. 5A, displays the transient wave form output without applying any signal equalization based on single-tap time based feed forward equalization architecture 300 and as shown, exhibits 6.3 ps of ISI jitter. FIG. 5B displays the transient wave form output applying signal equalization based on single-tap time based feed forward equalization architecture 300 and as shown, exhibits 1.83 ps of ISI jitter and thus reducing the ISI jitter by 4.47 ps and improving the timing margin for the system.

Although the present implementations have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A circuit for dynamically modulating a high frequency bit duration of data based on a status of one or more previous transmitted bits comprising:
   a first data path comprising a first input, a first buffer, and a first output connected to a first multiplexer data input;
   a second data path comprising a second input, a second buffer, a phase interpolator, and a second output coupled to a second multiplexer data input;
   a multiplexer having at least two data inputs, at least one control input, and a common output coupled to a transmitter signal line; and
   wherein the first input and the second input are operatively coupled to a serialized data signal, and wherein the at least one control input is operatively coupled to a generated control signal that is based on the status of one or more previous transmitted bits.

2. The circuit of claim 1, wherein the multiplexer selects one of the first data path or the second data path to transmit a dynamically modulated output signal through the common output through the transmitter signal line based on the generated control signal.

3. The circuit of claim 1, wherein a high speed transmitter is driven by the common output of the multiplexer and operatively coupled by the transmitter signal line.

4. The circuit of claim 1, wherein the phase interpolator is configured to add a programmable delay to the second data path.

5. The circuit of claim 4, wherein the programmable delay is controlled by a tap coefficient and is process voltage and temperature independent.

6. The circuit of claim 1, further comprising:
m+1 data paths comprising m+1 inputs, m+1 buffers, m phase interpolators, and m+1 outputs coupled to the multiplexer with m+1 data input and m control signals are based on previous m bit transitions, and wherein m represents a number of tap coefficients associated with a programmable delay.

7. The circuit of claim 1, wherein each of the first buffer and the second buffer operate at a core voltage level and are configured to provide a digital signal transformation from one portion of the circuit to another portion of the circuit.

8. The circuit of claim 1, wherein the circuit is implemented in a digital domain utilizing one or more digital logic gates, one or more inventers, and one or more multiplexers, such that the circuit is implemented outside an input/output area.

9. A time based feed-forward equalization method comprising:
receiving a serialized data signal;
commonly providing the serialized data signal to a flip-flop and a control signal generator;
commonly providing an output of the flip-flop into a first data path and a second data path;
applying a programmable delay to the second data path;
receiving, at a multiplexer, an early data signal from the first data path, a late data signal from the second data path, and a generated control signal from the control signal generator, wherein the generated control signal is based on a status of one or more previous transmitted bits; and
sending, by the multiplexer, a dynamically modulated output signal.

10. The method of claim 9, further comprising:
determining a maximum delay modulation based on the early data signal and the late data signal; and
selecting, by the multiplexer, the early data signal or the late data signal to be used as the dynamically modulated output signal based on the status of one or more previous transmitted bits.

11. The method of claim 9, further comprising:
commonly providing the output of the flip-flop into m+1 data path;
applying m programmable delay to generate m delayed data paths; and
providing, to the multiplexer, m+1 data signals and m control signals based on previous m transmitted bits, and wherein m represents m represents a number of tap coefficients associated with the programmable delay.

12. The method of claim 11, further comprising:
determining a maximum delay modulation based on the m+1 data signals; and
selecting, by the multiplexer, one of the m+1 data signals to be used as the dynamically modulated output signal based on the status of one or more previous transmitted bits.

13. The method of claim 9, wherein the programmable delay is controlled by a tap coefficient and is process voltage and temperature independent.

14. The method of claim 9, wherein the serialized data signal provides the status of one or more previous transmitted bits.

* * * * *